United States Patent
Schwent et al.

[11] Patent Number: 6,112,059
[45] Date of Patent: Aug. 29, 2000

[54] OFF-CHANNEL LEAKAGE POWER MONITOR APPARATUS AND METHOD

[75] Inventors: Dale Gerard Schwent, Schaumburg; Clint Howard Neuzil, Chicago, both of Ill.

[73] Assignee: Motorola, Inc., Schaumburg, Ill.

[21] Appl. No.: 08/968,625

[22] Filed: Nov. 12, 1997

[51] Int. Cl.[7] .................................................. H04B 1/00
[52] U.S. Cl. .............................................. 455/67.1; 455/76
[58] Field of Search ........................... 455/76, 86, 67.1, 455/115, 423, 424, 425, 226.1, 126

[56] References Cited

U.S. PATENT DOCUMENTS

| | | | |
|---|---|---|---|
| 5,066,923 | 11/1991 | Gailus et al. | 330/107 |
| 5,119,040 | 6/1992 | Long et al. | |
| 5,524,285 | 6/1996 | Wray et al. | 455/126 |
| 5,574,992 | 11/1996 | Cygan et al. | 455/126 |
| 5,732,330 | 3/1998 | Anderson et al. | 455/76 |
| 5,890,051 | 3/1999 | Schalang et al. | 455/76 |
| 5,907,797 | 3/1999 | Hanatatsu et al. | 455/115 |

FOREIGN PATENT DOCUMENTS

| | | |
|---|---|---|
| 2 254 973 | 10/1992 | United Kingdom . |
| 2329538 | 3/1999 | United Kingdom .............. H03F 1/32 |
| 93/18581 A1 | 9/1993 | WIPO . |

*Primary Examiner*—Nguyen Vo
*Assistant Examiner*—Makoto Aoki
*Attorney, Agent, or Firm*—Sylvia Chen

[57] ABSTRACT

An off-channel leakage power monitor implemented in a transceiver (100) dynamically measures adjacent and alternate channel leakage power produced by nonlinearities in a transmitter (110) power amplifier (116). A main local oscillator (124), offset voltage-controlled oscillator (122), and second local oscillator (170) are adjusted to obtain on-channel power, adjacent channel power, and alternate channel power measurements using a measurement calculator (185) implemented in a digital signal processor (180) or as a gate array in a receiver (140). Once the off-channel leakage power measurements have been obtained, any number of techniques can be used to extract increased efficiency from the power amplifier (116) while maintaining acceptable linearity under changing operating conditions.

8 Claims, 4 Drawing Sheets

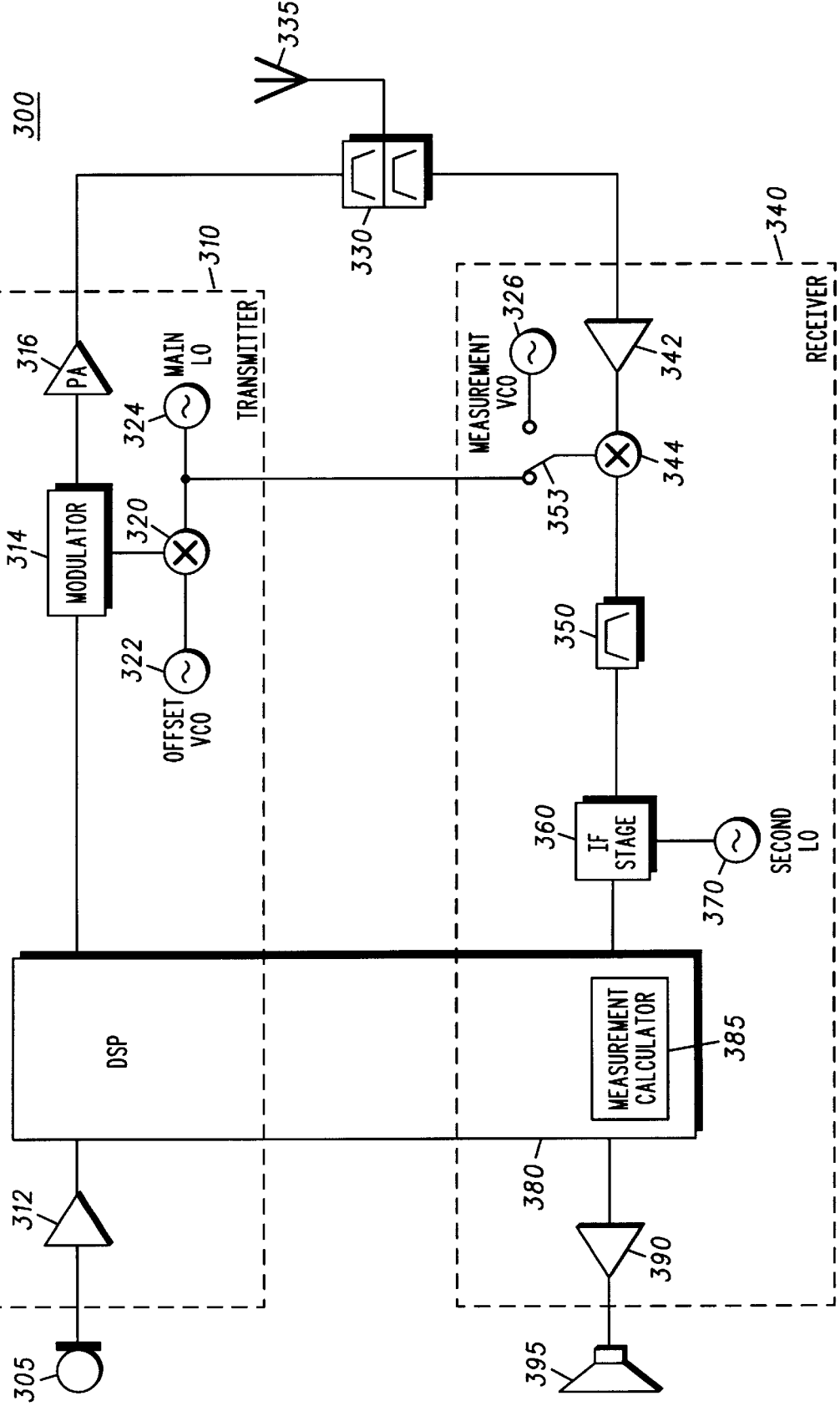

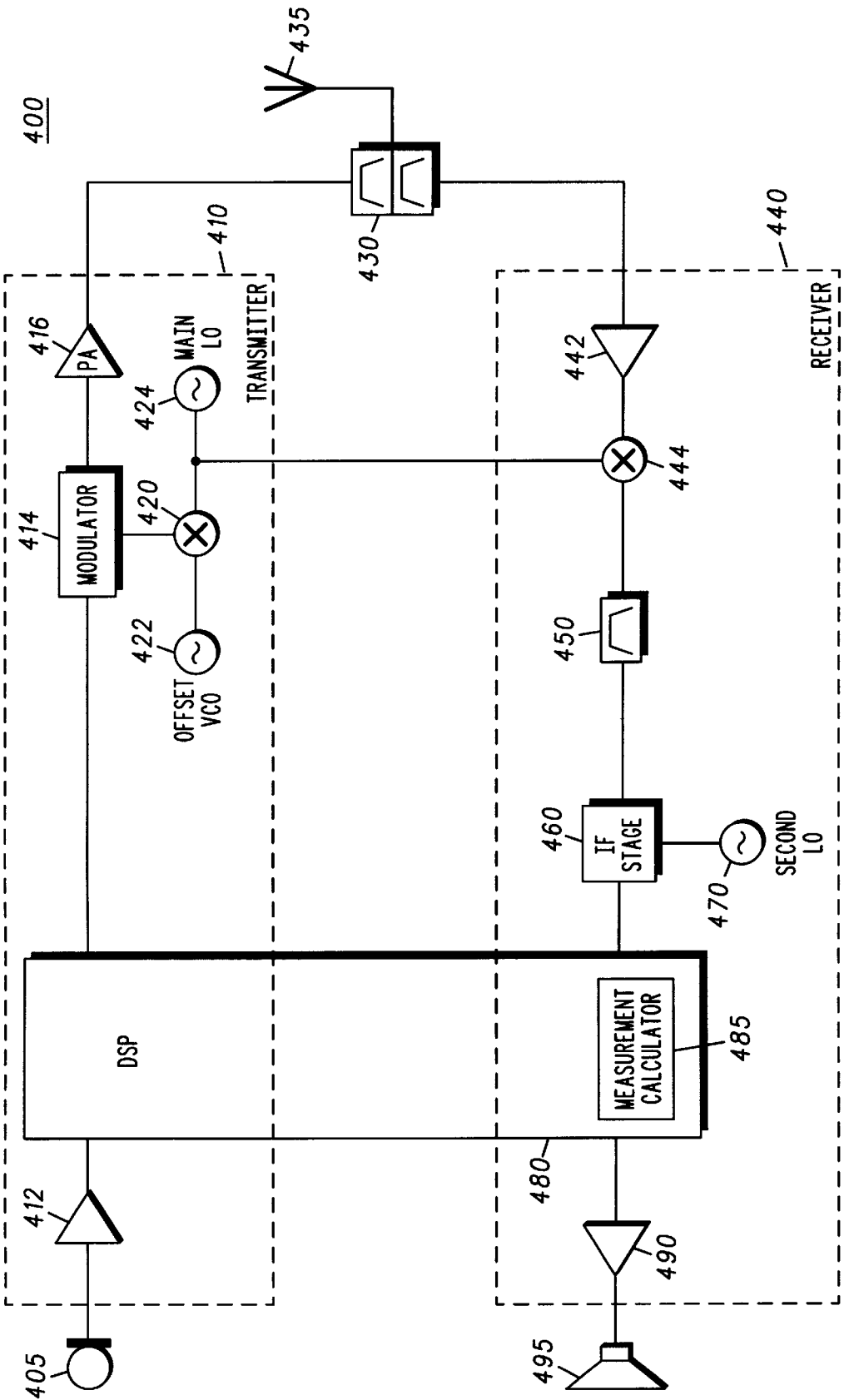

OFF-CHANNEL LEAKAGE POWER MONITOR APPARATUS AND METHOD

FIELD OF THE INVENTION

This invention relates generally to linear transmitters, and more particularly to measuring adjacent channel power and alternate channel power in linear transmitters.

BACKGROUND OF THE INVENTION

A critical design parameter for any linear transmitter is spectral spreading. Nonlinearities in the transmitter produce spectral regrowth in adjacent and alternate channels, or off-channels, that can reduce overall system performance in a multi-user system. Communication system specifications typically place limits on the amount of regrowth that will be allowable in order to maintain good system performance, and each transmitter must keep its spectral regrowth below those limits for all performance conditions, including temperature fluctuations, load variations, and voltage variations.

In the United States Time Division Multiple Access (US TDMA) wireless communication system, transmitter linearity is specified in terms of adjacent and alternate channel leakage power. As defined in Interim Specification 54 (IS-54) and Interim Specification 136 (IS-136) documents, the measurement of off-channel leakage power is performed by determining the total power that a receiver would intercept if tuned to an adjacent or alternate transmit channel, then comparing those measurements to the power that would be intercepted by that same receiver when tuned to the desired transmit channel. The test receiver is defined to have the same square root raised cosine (SRRC) selectivity filter as real receivers in the system. For US TDMA, limits for off-channel leakage power measurements are: (1) adjacent channel power shall be 26 dB down from on-channel power; and (2) alternate channel power shall be 45 dB down from on-channel power.

To maintain linearity in the face of variable conditions, the current design approach is to provide sufficient linearity margin under nominal conditions to allow for performance condition variations. To provide this design margin, the transmitter must be sufficiently far from saturation so that it will not saturate under any of the extremes of its operation conditions. Because proximity to the saturated condition is required for good efficiency, this built-in design margin creates a direct trade-off in designing for good efficiency versus designing for good linearity. A conventional transmitter designed with sufficient linearity at its operating extremes will have degraded efficiency under nominal conditions, while a transmitter with better nominal efficiency will not maintain linearity at its operating extremes. Thus, there is a need for a linear transmitter that is capable of maintaining good efficiency in a variety of operating conditions.

BRIEF DESCRIPTION OF THE DRAWINGS

FIG. 3 shows an off-channel leakage power monitor implemented in a radiotelephone transceiver according to a third preferred embodiment.

FIG. 4 shows an off-channel leakage power monitor implemented in a radiotelephone transceiver according to a fourth preferred embodiment.

DETAILED DESCRIPTION OF THE PREFERRED EMBODIMENTS

The off-channel leakage power monitor dynamically measures the adjacent channel power and the alternate channel power produced by the transmitter. The off-channel leakage power monitor can be used to determine when the power amplifier has become sufficiently non-linear to violate the system specification. Once the non-linearity point has been determined, any number of techniques can be used to hold the power amplifier at the limits of linearity and extract the maximum efficiency from the power amplifier under changing operating conditions. Some of the possible techniques for maintaining linearity and maximizing efficiency are power amplifier load adjustment, power output adjustment, power amplifier supply adjustment, or predistortion. The off-channel leakage power monitor measures power amplifier linearity using a combination of existing transceiver hardware, new transceiver hardware, and software.

For a TDMA system, the transceiver already has a SRRC selectivity filter in an intermediate frequency stage as part of its design, so the receiver portion is capable of processing the signal required by the IS-54/IS-136 specifications for transmitter adjacent and alternate channel leakage power measurements. Also, since the receiver hardware is idle during a transmit burst, it is available for use by the off-channel leakage power monitor at this time. If a signal strength measurement can be made accurately and within the 6.67 ms TDMA transmit time slot, the transceiver's own receiver could be used to measure the transmitter's on channel, adjacent channel, and alternate channel powers. Not only can the off-channel leakage power monitor be implemented in a TDMA system, but the off-channel leakage power monitor can be implemented in any linear transmitter communication system where the receiver has idle periods that are available for transmitter off-channel power measurements. Additional systems where the off-channel leakage power monitor can be implemented are Personal Digital Cellular (PDC), iDEN®, and IRIDIUM® communication systems.

Figure 1:
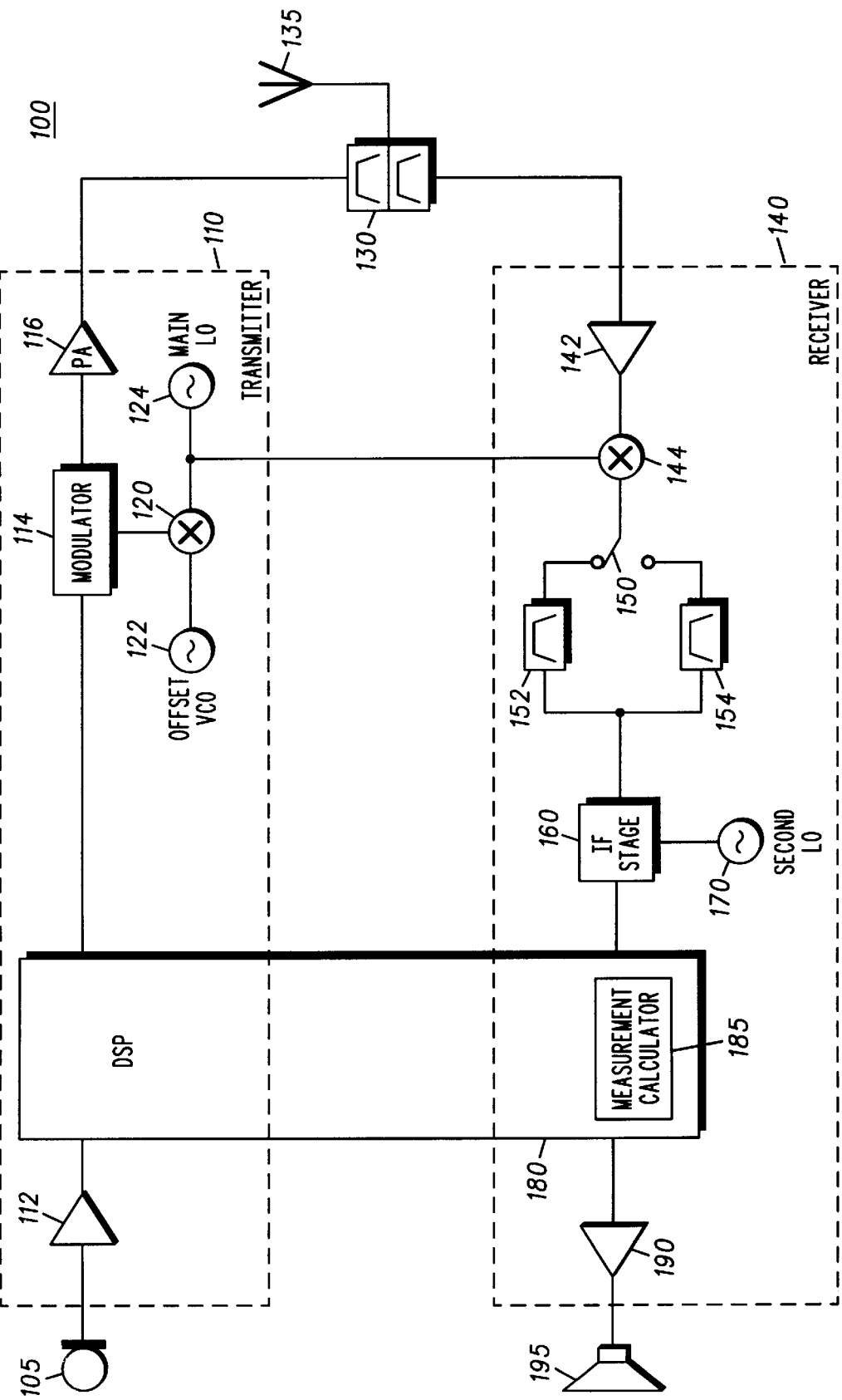
FIG. 1 shows an off-channel leakage power monitor implemented in a radiotelephone transceiver according to a first preferred embodiment.

FIG. 1 shows an off-channel leakage power monitor implemented in a radiotelephone transceiver 100 according to a first preferred embodiment. In all of the drawings, a dual-conversion zero intermediate frequency TDMA receiver and direct-modulated transmitter is contemplated, although other transmitter and receiver configurations, such as offset modulated transmitters, can use the off-channel leakage power monitor. This embodiment uses a transmitter 110 having a main local oscillator (LO) 124 and an offset voltage-controlled oscillator (VCO) 122 for creating a carrier frequency.

In the standard transmit/receive mode, a microphone 105 obtains an audio input signal (or a data device sends digital data input signals) to a transmitter 110. An amplifier 112 in the transmitter 110 amplifies the input signal and couples it to a digital signal processor (DSP) 180, which is shared by both the transmitter 110 and a receiver 140. The DSP 180 processes the amplified input signal to create a baseband modulation signal and couples the baseband modulation signal to a modulator 114.

The modulator 114 uses a carrier signal from a mixer 120 and modulates the carrier with the baseband modulation signal from the DSP 180. The mixer 120 inputs are from a main LO 124 and an offset VCO 122. Modulation, however, can be implemented in other ways, such as using offset modulation where the offset VCO 122 signal is modulated by the baseband modulation signal from the DSP 180 and then mixed with the main LO 124 signal.

For this TDMA example, the nominal frequency of the main LO is 926.55 MHz and the nominal frequency of the offset VCO is 90 MHz. This creates the required US TDMA carrier frequency of 836.55 MHz at the output of the mixer 120. The modulated signal from modulator 114 is coupled to a power amplifier 116. The amplified modulated signal from the transmitter 110 is coupled to a duplexer filter 130 and transmitted to a complementary communication device (not shown), such as a TDMA base station, via an antenna 135.

The antenna 135 also receives desired modulated signals at 881.55 MHz from the complementary communication device (not shown). The modulated signal is coupled to the duplexer filter 130, and sent to the receiver 140 of the mobile station transceiver 100. A pre-amplifier 142 such as a low-noise amplifier, in the receiver 140 amplifies the modulated signal and a mixer 144 down-converts the desired modulated signal using the 926.55 MHz signal from the main LO 124. In the standard transmit/receive mode, a 45 MHz receiver IF filter 152 is used to filter the desired IF signal. The IF signal is coupled to the IF stage 160, which further filters and down-converts the 45 MHz signal to baseband using a second LO 170 operating at 45 MHz. The DSP 180 processes the baseband signals and couples them to an amplifier 190 which in turn is coupled to an audio speaker 195 (or a data device).

In measurement mode, the frequencies of the main LO 124 and the offset VCO 122 are varied slightly to acquire the on-channel and off-channel powers, which are used to determine whether adjacent or alternate channel leakage power resulting from possible nonlinearities in the power amplifier 116 are within specification requirements. For a TDMA system, the main LO 124 and the offset VCO 122 in the transmitter 110 are varied ±30 kHz from their nominal values for transmitting while measuring adjacent channels. Similarly, to measure alternate channel leakage power, the main LO 124 and the offset VCO 122 in the transmitter 110 are varied ±60 kHz from their nominal values. This maintains the modulation frequency of the transmitter 110 at the required 836.55 MHz while allowing the receiver 140 to use the same main LO 124 when making adjacent and alternate channel power measurements.

The receiver 140 measures the on-channel power by mixing an on-channel 836.55 MHz modulated signal received by the antenna 135 with the predetermined corresponding on-channel main LO 124 frequency of 926.55 MHz. This creates an IF signal at 90 MHz. In order to obtain the on-channel power measurement, the second LO 170 needs to hop to a different frequency, 90 MHz, which requires a second IF filter path through 90 MHz receiver IF filter 154 and a dual-band VCO as the second LO 170. Switch 150 couples the IF signal from mixer 144 to the 90 MHz IF filter 154 during measurement mode and couples the IF signal to 45 MHz IF filter 152 during the standard transmit/receive mode.

For adjacent channel power measurements, the transmitter 110 adjusts the main LO frequency to 926.52 or 926.58 MHz and correspondingly adjusts the offset VCO frequency to either 89.97 or 90.03 MHz. Thus, the transmit frequency remains at 836.55 MHz. Meanwhile, the receiver 140 mixes the 836.52 MHz or 836.58 MHz adjacent channel modulated signal with the corresponding predetermined adjacent channel main LO frequency, 926.52 or 926.58 MHz. This again creates IF signals at 90 MHz, which are routed by switch 150, filtered by 90 MHz IF filter 154 and mixed down to baseband by the dual-band second LO 170 operating at 90 MHz.

Finally, for alternate channel power measurements, the transmitter adjusts the main LO frequency to either 926.49 or 926.61 MHz and correspondingly adjusts the offset VCO frequency to 89.94 or 90.06 MHz. Meanwhile, the modulated signals at 836.49 or 836.61 MHz at the receiver 140 are mixed with their corresponding predetermined main LO 124 frequencies of 926.49 MHz or 926.61 MHz. The 90 MHz IF signal is then filtered by IF filter 154 and further down-converted to baseband by IF stage 160 and second LO 170 operating at 90 MHz.

When the on-channel, adjacent channel, and alternate channel signals are converted to baseband, a measurement calculator 185 preferably implemented in the DSP 180 determines the adjacent and alternate channel leakage powers. The measurement calculator 185 can alternately be implemented as a gate array using digital logic. For a TDMA system, adjacent channel power must be 26 dB down from on-channel power and alternate channel power must be 45 dB down from on-channel power. The results of the measurement calculation can be used to adjust the operating parameters of the transmitter 110 dynamically. For example, the power of the signal at the output of the power amplifier 116 could be decreased to maintain linearity if the amplifier exceeded specifications. Alternatively, a supply (not shown) such as a main or bias supply to the power amplifier 116 could be adjusted to increase efficiency to the boundary of linearity allowed by the communication system specification as measured by the measurement calculator 185. Alternately, an adjustable matching network (not shown) could be activated at the output of the power amplifier 116 to vary the load from the duplexer filter 130 and the antenna 135. Or, at the input to the power amplifier 116, a predistorter (not shown) with an adjustable predistortion algorithm could obtain feedback from the measurement calculator 185 to maintain the highest efficiency while staying within linearity bounds. Various other methods of dynamically adjusting the power amplifier 116 according to the measurement calculator 185 results to obtain high efficiency and acceptable linearity are also available.

This embodiment provides off-channel leakage power measurements with the addition of a second IF filter 154, a switch 150, a measurement calculator 185, a dual-band second LO 170, and only minor adjustments to the main LO 124 and the offset VCO 122.

Figure 2:
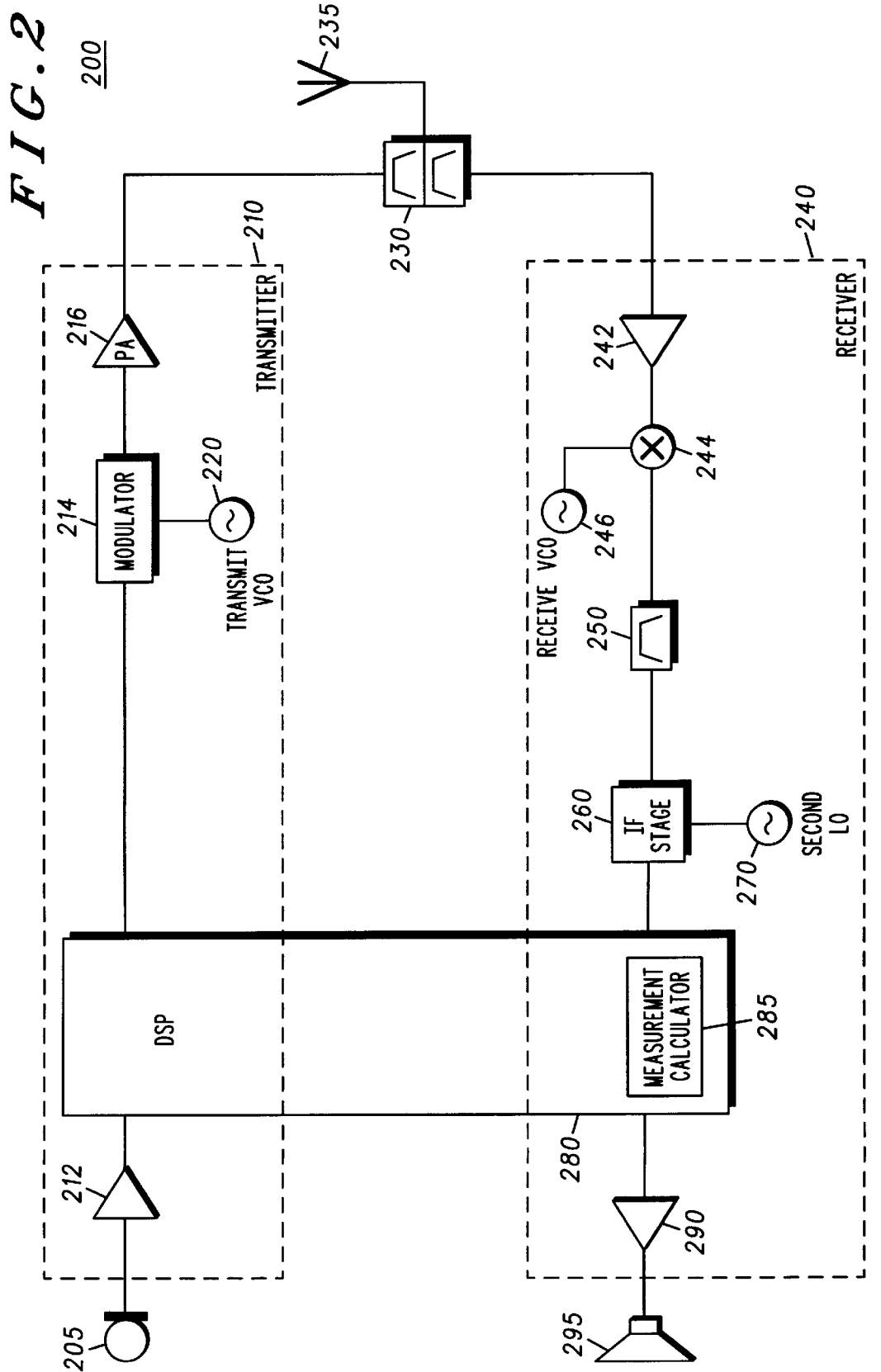
FIG. 2 shows an off-channel leakage power monitor implemented in a radiotelephone transceiver according to a second preferred embodiment.

FIG. 2 shows an off-channel leakage power monitor implemented in a radiotelephone transceiver 200 according to a second preferred embodiment. This embodiment uses a direct-launched VCO, which simplifies the configuration of the off-channel leakage power monitor.

During the standard transmit/receive mode, a microphone 205 obtains an audio input signal (or a data device sends digital data input signals) to a transmitter 210. An amplifier 212 in the transmitter 210 amplifies the signals and couples them to a DSP 280, which processes the amplified input signal to create a baseband modulation signal. In this embodiment, the same DSP 280 is shared by both the transmitter 210 and a receiver 240. The baseband modulation signal from the DSP 280 is coupled to a modulator 214. The modulator 214 uses the baseband modulation signal to modulate directly a signal from a transmit VCO 220. For this TDMA example, the frequency of the transmit VCO is 836.55 MHz. The modulated signal from modulator 214 is coupled to a power amplifier 216. The amplified modulated signal at 836.55 MHz from the transmitter 210 is coupled to a duplexer filter 230 and transmitted to a complementary communication device (not shown), such as a TDMA base station, via an antenna 235.

The antenna 235 also receives desired 881.55 MHz modulated signals from the complementary communication device (not shown). The modulated signal is coupled to the duplexer filter 230, and sent to the receiver 240 of the mobile station transceiver 200. A pre-amplifier 242 such as a low-noise amplifier amplifies the modulated signal and a mixer 244 demodulates the modulated signal using a receive VCO 246 operating at 925.55 MHz. A 45 MHz receiver IF filter 250 is used to filter the desired IF signal. The 45 MHz IF signal is coupled to the IF stage 260, which further filters and down-converts the 45 MHz IF signal to baseband using a second LO 270 operating at 45 MHz. The DSP 280 processes the digital baseband signals and couples them to an amplifier 290 which in turn is coupled to an audio speaker 295 (or a data device).

In this embodiment, for a TDMA system, the measurement mode would capture adjacent channels at 836.52 MHz and 836.58 MHz and alternate channels at 836.49 MHz and 836.61 MHz. During measurement mode, the transmitter 210 would remain the same, but the receive VCO 246 in the receiver 240 would be altered to demodulate adjacent and alternate channel power as well as the on-channel power. The predetermined receive VCO 246 frequencies needed to demodulate adjacent channels would be 791.52 MHz and 791.58 MHz for a US TDMA system, while the predetermined receive VCO 246 frequencies needed to demodulate alternate channels would be 791.49 MHz and 791.61 MHz. This would probably require a dual-band VCO as the receive VCO 246. In the measurement mode, the dual-band receive VCO 246 would hop to the adjacent and alternate channel demodulation frequencies, and the IF signal would remain at 45 MHz. Thus, the same IF filter 250 and second LO 270 could be used in both the standard transmit/receive mode and the measurement mode.

The measurement calculator 285 would store on-channel, adjacent channel, and alternate channel power measurements to determine if the off-channel leakage power is within specifications. Or the measurement calculator can be implemented as a gate array. Various methods, including the methods outlined earlier, can be used to maintain power amplifier 216 linearity and increase transmitter 210 efficiency. This embodiment, however, is presently limited due to the difficulties in maintaining transmit VCO 220 output signal integrity while the antenna 235 is transmitting at the same frequency as the transmit VCO.

FIG. 3 shows an off-channel leakage power monitor implemented in a radiotelephone transceiver 300 according to a third preferred embodiment. Like the embodiment shown in FIG. 1, this embodiment is based off a direct-modulated transmitter design; however, the off-channel leakage power monitor can also be implemented using an offset modulated transmitter with relatively few changes. This embodiment, however, does not require any significant frequency hopping by VCOs and thus eliminates the need for dual-band VCOs at the expense of adding a measurement VCO 326.

In the standard transmit/receive mode, a microphone 305 obtains an audio input signal (or a data device sends digital data input signals) to a transmitter 310. An amplifier 312 in the transmitter 310 amplifies the digital signals and couples them to a DSP 380. The DSP 380 is shared by both the transmitter 310 and a receiver 340. The baseband modulation signal output of the DSP 380 is coupled to a modulator 314. The modulator 314 uses the baseband modulation signal to modulate a signal from a mixer 320. The mixer 320 inputs are from a main LO 324 and an offset VCO 322. In this US TDMA example, the frequency of the main LO is 926.55 MHz and the frequency of the offset VCO is 90 MHz, which creates the required carrier frequency of 836.55 MHz at the output of the mixer 320. The modulated signal from modulator 314 is coupled to a power amplifier 316. The amplified modulated signal from the transmitter 310 is coupled to a duplexer filter 330 and transmitted to a complementary communication device (not shown), such as a TDMA base station, via an antenna 335.

In the standard transmit/receive mode, the antenna 335 also receives desired 881.55 MHz modulated signals from the complementary communication device (not shown). The modulated signal is coupled to the duplexer filter 330 and sent to the receiver 340 of the mobile station transceiver 300. A pre-amplifier 342 such as a low noise amplifier amplifies the modulated signal and a mixer 344 demodulates the modulated signal using the 926.55 MHz signal from the main LO 324. In the standard transmit/receive mode, a 45 MHz receiver IF filter 350 is used to filter the desired IF signal. The IF signal is coupled to the IF stage 360, which further filters and down-converts the 45 MHz signal to baseband using a second LO 370 operating at 45 MHz. The DSP 380 processes the baseband signals and couples them to an amplifier 390 which in turn is coupled to an audio speaker 395 (or a data device).

In measurement mode, a switch 353 in the receiver 340 couples a measurement VCO 326 to the mixer 344 rather than coupling the main LO 324 to the mixer 344. For US TDMA, the measurement VCO 326 operates at the predetermined frequencies of 791.55 MHz, which can be used to demodulate the on-channel power, 791.51 MHz and 791.58 MHz, which can be used to demodulate adjacent channel power, and 791.49 MHz and 791.61 MHz, which can be used to demodulate alternate channel power. With the measurement VCO 326, the IF signal would remain at 45 MHz. A measurement calculator 385, preferably implemented in the DSP 380 or as a gate array, is used to calculate the adjacent and alternate channel leakage power. Using the information from the measurement calculator 385, various methods such as those outlined earlier can be used to maintain linearity and increase efficiency in the power amplifier 316 under dynamically-changing operating conditions. Thus in this embodiment, the same IF filter 350 and second LO 370 can be used in both the standard transmit/receive mode and the measurement mode.

FIG. 4 shows an off-channel leakage power monitor implemented in a radiotelephone transceiver 400 according to a fourth preferred embodiment. This embodiment is a variation on the embodiment shown in FIG. 1. The frequencies to which the main LO 424 and the offset VCO 422 need to hop, however, have been changed to eliminate the need for a second IF filter path.

Like the transceiver shown in FIG. 1, in the standard transmit/receive mode a microphone 405 obtains an audio input signal (or a data device sends digital data input signals) to a transmitter 410. An amplifier 412 in the transmitter 410 amplifies the input signals and couples them to a DSP 480. The DSP 480 in this embodiment is used in both the transmitter 410 and a receiver 440. The baseband modulation signal output of the DSP is coupled to a modulator 414. The modulator uses the baseband modulation signal to modulate a signal from a mixer 420. The mixer 420 inputs are from a main LO 424 and an offset VCO 422. In this TDMA example, the nominal frequency of the main LO is 993.87 MHz and the nominal frequency of the offset VCO is 157.32 MHz, which creates the required carrier frequency of 836.55 MHz at the output of the mixer 420. The modulated signal from modulator 414 is coupled to a power amplifier 416. The amplified modulated signal from the transmitter 410 is coupled to a duplexer filter 430 and transmitted to a complementary communication device (not shown), such as a TDMA base station, via an antenna 435.

The antenna 435 also receives desired 881.55 MHz modulated signals from the complementary communication device (not shown). The modulated signal is coupled to the duplexer filter 430, and sent to the receiver 440 of the mobile station transceiver 400. A pre-amplifier 442 such as a low noise amplifier amplifies the modulated signal, and a mixer 444 demodulates the modulated signal using the 993.87 MHz signal from the main LO 424. In the standard transmit/receive mode, a 112.32 MHz receiver IF filter 450 is used to filter the desired IF signal. The IF signal is coupled to the IF stage 460, which further filters and down-converts the 112.32 MHz signal to baseband using a second LO 470 operating at 112.32 MHz. The DSP 480 processes the baseband signals and couples them to an amplifier 490 which in turn is coupled to an audio speaker 495 (or a data device).

In measurement mode, both the main LO 424 and the offset VCO 422 hop frequencies, which requires a dual-band main LO 424 and a dual-band offset VCO 422. To measure on-channel power, the main LO 424 hops to 948.87 MHz and the offset VCO 422 hops to 112.32 MHz. Thus, the modulation frequency remains 836.55 MHz. In the receiver 440, the mixer 444 uses the 948.87 MHz frequency from the main LO to demodulate the on-channel 836.55 MHz received signal down to 112.32 MHz. After filtering by IF filter 450 and IF stage 460, the measurement calculator 485, preferably implemented in the DSP 480 or as a gate array, calculates the on-channel power. To calculate adjacent channel power, the main LO 424 hops to either 948.84 MHz or 948.90 MHz while the offset VCO 422 hops to 112.29 MHz or 112.35 MHz. To calculate alternate channel power, the main LO 424 hops to either 948.81 MHz or 948.93 MHz while the offset VCO 422 hopes to either 112.26 MHz or 112.38 MHz. Then, the measurement calculator 485 can determine the adjacent and alternate channel leakage power.

The leakage power measurements from the measurement calculator 485 can be used to increase the efficiency of the power amplifier 416 while maintaining acceptable linearity according to system specifications. This embodiment maintains a consistent IF frequency of 112.32 MHz in both the standard transmit/receive and measurement modes, while reducing implementation difficulties in manufacturing a oscillator for the offset VCO and the main LO with a wider frequency range.

Thus, the off-channel leakage power monitor dynamically measures the adjacent and alternate channel leakage power of a transmitter. The measurement results can be used to increase transmitter power amplifier efficiency yet maintain linearity requirements under a variety of changing operating conditions. While specific components and functions of the off-channel leakage power monitor are described above, fewer or additional functions could be employed by one skilled in the art within the true spirit and scope of the present invention. The invention should be limited only by the appended claims.

We claim:

1. An off-channel leakage power monitor for a transceiver comprising:

a transmitter, for transmitting modulated signals, having a main local oscillator and an offset voltage-controlled oscillator coupled to a modulator input, and a power amplifier coupled to a modulator output;

a receiver, for receiving modulated signals, having the main local oscillator coupled to a mixer, and the mixer and a second local oscillator coupled to an intermediate frequency stage input; and a measurement calculator, for determining channel power, coupled to an intermediate frequency stage output.

2. An off-channel leakage power monitor according to claim 1 wherein the main local oscillator is a dual-band voltage-controlled oscillator for hopping to at least one predetermined frequency during a measurement mode.

3. An off-channel leakage power monitor according to claim 1 wherein the offset voltage-controlled oscillator is a dual-band voltage-controlled controlled oscillator for hopping to at least one predetermined frequency during a measurement mode.

4. An off-channel leakage power monitor according to claim 1 wherein the second local oscillator is a dual-band voltage-controlled oscillator for hopping to at least one predetermined frequency during a measurement mode.

5. An off-channel leakage power monitor for a transceiver comprising:

a transmitter, for transmitting modulated signals, having a transmit voltage-controlled oscillator coupled to a modulator input, and a power amplifier coupled to a modulator output;

a receiver, for receiving modulated signals, having a receive voltage-controlled oscillator coupled to a mixer, and the mixer and a second local oscillator coupled to an intermediate frequency stage input; and a measurement calculator, for determining channel power, coupled to an intermediate frequency stage output.

6. An off-channel leakage power monitor according to claim 5 wherein the receive voltage-controlled oscillator is a dual-band voltage-controlled oscillator for hopping to at least one predetermined frequency during a measurement mode.

7. An off-channel leakage power monitor for a transceiver comprising:

a transmitter, for transmitting modulated signals, having a main local oscillator and an offset voltage-controlled oscillator coupled to a modulator input, and a power amplifier coupled to a modulator output;

a receiver, for receiving modulated signals, having the main local oscillator and a measurement voltage-controlled oscillator selectively coupled to an input of a switch, an output of the switch coupled to a mixer, and the mixer and a second local oscillator coupled to an intermediate frequency stage input; and a measurement calculator, for determining channel power, coupled to an intermediate frequency stage output.

8. An off-channel leakage power monitor according to claim 7 wherein the switch couples the main local oscillator to the mixer during a standard transmit/receive mode and the switch couples the measurement voltage-controlled oscillator to the mixer during a measurement mode, and the measurement voltage-controlled oscillator is a voltage-controlled oscillator for hopping to at least one predetermined frequency during the measurement mode.

* * * * *